(12) United States Patent
Yang

(10) Patent No.: US 11,664,798 B2
(45) Date of Patent: May 30, 2023

(54) POWER GATING CIRCUIT

(71) Applicant: IPGoal Microelectronics (Sichuan) Co., Ltd., Sichuan (CN)

(72) Inventor: Baoding Yang, Sichuan (CN)

(73) Assignee: IPGOAL MICROELECTRONICS (SICHUAN) CO., LTD., Sichuan (CN)

( * ) Notice: Subject to any disclaimer, the term of this patent is extended or adjusted under 35 U.S.C. 154(b) by 0 days.

(21) Appl. No.: 17/663,868

(22) Filed: May 18, 2022

(65) Prior Publication Data

US 2022/0376688 A1  Nov. 24, 2022

(30) Foreign Application Priority Data

May 19, 2021 (CN) .......................... 202110544556.6

(51) Int. Cl.
*H03K 17/687* (2006.01)
*G05F 3/02* (2006.01)
*H03K 17/082* (2006.01)
*H03K 19/00* (2006.01)

(52) U.S. Cl.
CPC ............ *H03K 17/687* (2013.01); *G05F 3/02* (2013.01); *H03K 17/0822* (2013.01); *H03K 19/0016* (2013.01)

(58) Field of Classification Search
CPC ..... G05F 3/02; H03K 17/0822; H03K 17/687

USPC ........................................ 327/427, 434, 437
See application file for complete search history.

(56) References Cited

U.S. PATENT DOCUMENTS

| | | | | |
|---|---|---|---|---|
| 6,097,177 A | * | 8/2000 | Sudo | H02J 7/0031 320/136 |
| 7,102,415 B1 | * | 9/2006 | Potanin | G01R 19/16571 327/434 |
| 2009/0212985 A1 | * | 8/2009 | Kasuga | H04N 25/75 341/156 |

* cited by examiner

*Primary Examiner* — William Hernandez
(74) *Attorney, Agent, or Firm* — Shimokaji IP

(57) ABSTRACT

A power gating circuit includes inverters and a voltage divider sub-circuit, a latch comparator, and a gated switch sub-circuit connected to an external power supply circuit of 5V, respectively. The voltage divider sub-circuit is configured to divide a voltage of 5V and output a first voltage and a second voltage to the latch comparator and the gated switch sub-circuit, both voltage values of the first voltage and the second voltage are smaller than a withstand voltage value of a field effect transistor, and the voltage value of the first voltage is greater than that of the second voltage; the latch comparator is configured to compare two signals output by the inverters and latch a comparison result; and the gated switch sub-circuit is further connected with the latch comparator to control an output voltage, thereby improving the stability of the circuit, and extending the using life of the entire circuit.

10 Claims, 1 Drawing Sheet

POWER GATING CIRCUIT

FIELD OF THE INVENTION

The present invention relates to the field of integrated circuits and, more particularly to a power gating circuit.

BACKGROUND OF THE INVENTION

With the development of large-scale integrated circuits, system-on-chip has been widely used in various fields, and the scale of ICs is also increasing, therefore the low-power and low-cost design has become an indispensable part of circuit design.

In the circuit design, conventional devices, such as CMOS devices using IO devices of 3.3V, etc. are usually used for cost control of the process, but a power supply circuit of 5V is usually configured for the power supply. When designing a circuit powered by a power supply of 5V by using IO devices of 3.3V, special attention should be paid to the problem of poor withstand voltage, that is, all CMOS devices of 3.3V in the circuit either in a normal operation state or a turn-off state are required to ensure the gate-source voltage value |VGS|, the gate-drain voltage value |VGD|, and the source-drain voltage value |VSD| of the CMOS device to be within a required voltage range. For example, for the IO devices of 3.3V, the above gate-source voltage value |VGS|, the gate-drain voltage value |VGD| and the source-drain voltage value |VSD| are require to be all within the range of 3.3V±10% in the general process, otherwise reduced life, electric leakage or abnormal operation will be occurred.

When the circuit is under the normal operation, diodes added on the circuit branch may solve the problem of poor withstand voltage. However, when the circuit is processed at low power consumption, for example, the circuit needs to be shut down when not in use to ensure the low power consumption, a problem of poor withstand voltage occurs unfortunately. Specifically, since all switching elements are conventional IO devices of 3.3V, and 5V voltage is used as the high level of the control switch, the conventional switch circuit design cannot guarantee the gate-source voltage value |VGS|, the gate-drain voltage value |VGD| and the source-drain voltage value |VSD| to be all within the voltage range required in the process (ie 3.3V±10%), as a result, there will be a problem of poor withstand voltage, which will affect the robustness of the entire circuit.

Therefore, it is necessary to provide a power gating circuit that can overcome the potential problem of poor withstand voltage of each device.

SUMMARY OF THE INVENTION

One objective of the present invention is to provide a power gating circuit, which can avoid the problem of poor withstand voltage on general devices with internal withstand voltage of 3.3V when the high voltage circuit is turned off, thereby improving the stability of the circuit, and extending the using life of the entire circuit.

To achieve the above-mentioned objective, a of the present invention includes a power gating circuit having two inverters and a voltage divider sub-circuit, a latch comparator, and a gated switch sub-circuit connected to an external power supply circuit of 5V, respectively; wherein the voltage divider sub-circuit is configured to divide a voltage of 5V output by the external power supply circuit of 5V and output a first voltage and a second voltage to the latch comparator and the gated switch sub-circuit, both voltage values of the first voltage and the second voltage are smaller than a withstand voltage value of a field effect transistor, and the voltage value of the first voltage is greater than that of the second voltage; the first voltage is configured to provide an operation voltage for the two inverters which are connected in series, an external control signal is input to the two inverters in sequence; the latch comparator is configured to compare two signals output by the two inverters and then latch a comparison result; and the gated switch sub-circuit is further connected with the latch comparator and configured to turn off or turn on the power gating circuit to control an output voltage according to a voltage value of the external control signal.

Preferably, the voltage divider sub-circuit is composed of N voltage divider field effect transistors which are connected in series in sequence, each of the voltage divider field effect transistors is connected to form a diode structure, a source of a first voltage divider field effect transistor is connected to the external power supply circuit of 5V, and a drain of the Nth voltage divider field effect transistor is grounded, wherein N is a natural number greater than 3.

Preferably, a respective gate of each of the voltage divider field effect transistors is connected to a respective drain thereof, a respective substrate is connected to a respective source thereof, and each of the voltage divider field effect transistors has a same width to length ratio.

Preferably, each of the voltage divider field effect transistors is a P-type field effect transistor, a first voltage is drawn from a source of a (i)th voltage divider field effect transistor, and a second voltage is correspondingly drawn from a source of a (i+1)th voltage divider field effect transistor, wherein 3<i<N, and i is a natural number.

Preferably, the latching comparator comprises a first field effect transistor, a second field effect transistor, a third field effect transistor, a fourth field effect transistor, a fifth field effect transistor, a sixth field effect transistor, a seventh field effect transistor and an eighth field effect transistor; sources of the first field effect transistor and the second field effect transistor are both connected to the external power supply circuit of 5V, and the first field effect transistor and the second field effect transistor are connected in a positive feedback manner; the second voltage is input to a gate of the third field effect transistor, a source of the third field effect transistor is connected to a drain of the first field effect transistor, and a drain of the third field effect transistor is connected to a drain of the fifth field effect transistor; the first voltage is input to a gate of the fifth field effect transistor, a source of the fifth field effect transistor is connected to a drain of the seventh field effect transistor; an output terminal of a second inverter is connected to a gate of the seventh field effect transistor, and a source of the seventh field effect transistor is grounded; the second voltage is input to a gate of the fourth field effect transistor, and a source of the fourth field effect transistor is connected to a drain of the second field effect transistor, and a drain of the fourth field effect transistor is connected to a drain of the sixth field effect transistor; the first voltage is input to a gate of the sixth field effect transistor, and a source of the sixth field effect transistor is connected to a drain of the eighth field effect transistor; an output terminal of a first inverter is connected to a gate of the eighth field effect transistor, and a source of the eighth field effect transistor is grounded.

Preferably, the gated switch sub-circuit comprises a ninth field effect transistor, a tenth field effect transistor, an eleventh field effect transistor and a twelfth field effect transistor; a drain of the ninth field effect transistor is connected to the external power supply circuit of 5V, a gate of the ninth field effect transistor is connected to the source of the third field effect transistor, a drain of the ninth field effect transistor is connected to a source of the tenth field effect transistor, and the second voltage is input to gates of the tenth and eleventh field effect transistors, a drain of the tenth field effect transistor and a drain of the eleventh field effect transistor together form an output terminal, a source of the eleventh field effect transistor is connected to a drain of the twelfth field effect transistor, a gate of the twelfth field effect transistor is connected to the drain of the seventh field effect transistor, and a source of the twelfth field effect transistor is grounded.

Preferably, the first field effect transistor, the second field effect transistor, the third field effect transistor, the fourth field effect transistor, the ninth field effect transistor and the tenth field effect transistor are all P-type field effect transistors, and their respective substrates are all connected to the external power supply circuit of 5V.

Preferably, the fifth field effect transistor, the sixth field effect transistor, the seventh field effect transistor, the eighth field effect transistor, the eleventh field effect transistor and the twelfth field effect transistor are all N-type field effect transistors, and their respective substrates are all connected to a low level.

Preferably, the first field effect transistor and the second field effect transistor are connected in a positive feedback manner, the gate of the first field effect transistor is connected to the drain of the second field effect transistor, and the gate of the second field effect transistor is connected to the drain of the second field effect transistor.

Preferably, the third field effect transistor, the fourth field effect transistor, the fifth field effect transistor, the sixth field effect transistor, the tenth field effect transistor and the eleventh field effect transistor are withstand voltage preventing switch transistors.

Compared with the prior art, in the power gate near circuit of the present invention, the voltage values of the first voltage and the second voltage output by the voltage divider sub-circuit are both smaller than the withstand voltage value of the field effect transistors, thus the voltages of other field effect transistors obtained through the first voltage or the second voltage are all smaller than their withstand voltage values, that is, problems of poor withstand voltage for all field effect transistors will not occurred during the circuit operation. Accordingly, there is also no withstand voltage problem inside the voltage divider sub-circuit due to the reasonable configuration of the voltage dividing mode of the voltage divider sub-circuit. Therefore, the power gating circuit of the present invention overcomes the influence of the withstand voltage problem on the circuit, improves the stability of the circuit, and extending the using life of the entire circuit.

The present invention will become more apparent from the following description in conjunction with the accompanying drawings, which are used to explain embodiments of the present invention.

DETAILED DESCRIPTION OF ILLUSTRATED EMBODIMENTS

Figure 1:
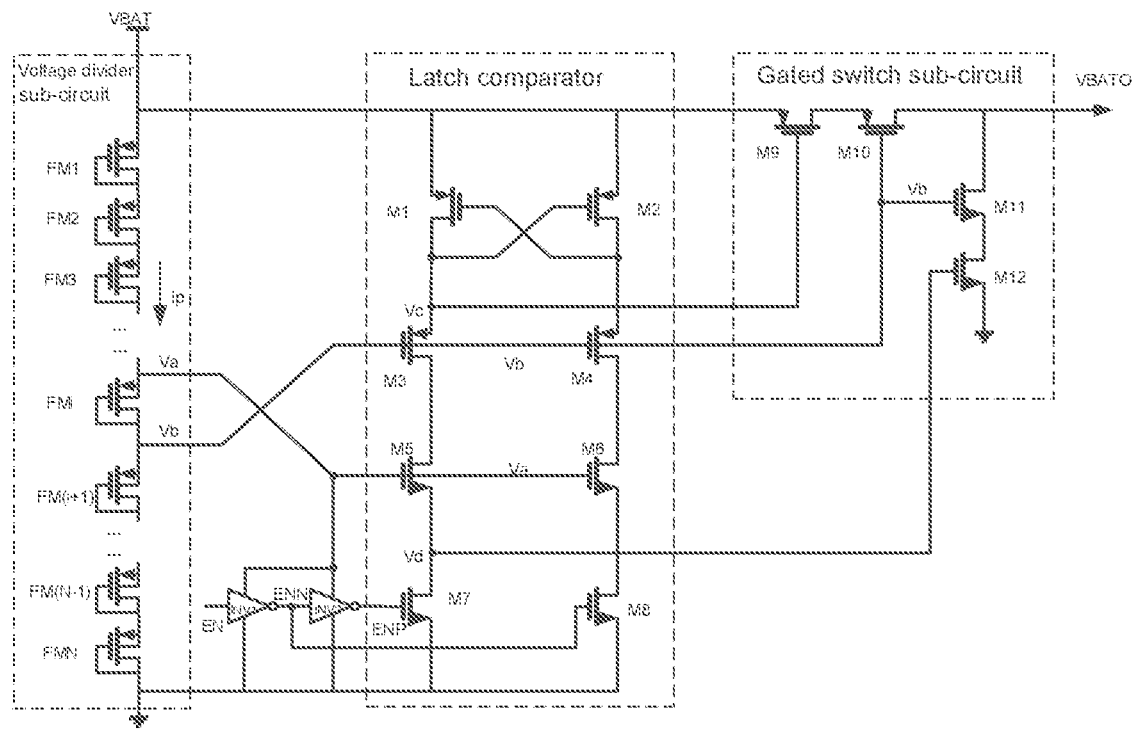
FIG. 1 is a circuit structure diagram of a power gating circuit of the present invention.

Various preferred embodiments of the invention will now be described with reference to the figures, wherein like reference numerals designate similar parts throughout the various views. As indicated above, the invention is directed to a Referring to FIG. 1, a power gating circuit according to the present invention is shown and includes two inverts (INV1, INV2) and a voltage divider sub-circuit, a latch comparator, and a gated switch sub-circuit connected to an external power supply circuit of 5V, respectively. The voltage divider sub-circuit is configured to divide a voltage of 5V VBAT output by the external power supply circuit of 5V and output a first voltage Va and a second voltage Vb to the latch comparator and the gated switch sub-circuit, both voltage values of the first voltage Va and the second voltage Vb are smaller than a withstand voltage value of a field effect transistor. In the present invention, all filed effect transistors are CMOS devices of 3.3V, namely the withstand voltage value of the field effect transistors is 3.3V. Specifically, the voltage value of the first voltage Va is greater than that of the second voltage Vb, the first voltage Va is configured to provide an operation voltage for the two inverters which are connected in series. An external control signal EN is input to the two inverters in sequence, specifically, the external control signal EN is input to the first inverter INV1, the output signal ENN of the first inverter INV1 is input to the second inverter INV2 and the latch comparator, and the output signal ENP of the second inverter INV2 is input to the latch comparator. The latch comparator is configured to compare two signals (namely signals ENN and ENP) output by the two inverters and then latch a comparison result. The gated switch sub-circuit is further connected with the latch comparator and configured to turn off or turn on the power gating circuit to control an output voltage according to a voltage value of the external control signal. In the present invention, the voltage values of the first voltage Va and the second voltage Vb output by the voltage divider sub-circuit are both smaller than the withstand voltage value of the field effect transistors, thus the voltages on other field effect transistors in the entire circuit that are obtain through the first voltage Va or the second voltage Vb are less than their withstand voltage values, that is, each field effect transistor will no longer have the problem of poor withstand voltage during the circuit operation. Accordingly, there is also no withstand voltage problem inside the voltage divider sub-circuit due to the reasonable configuration of the voltage dividing mode of the voltage divider sub-circuit. Therefore, the power gating circuit of the present invention overcomes the influence of the withstand voltage problem on the circuit, improves the stability of the circuit, and extending the using life of the entire circuit.

Specifically, in the present invention, the voltage divider sub-circuit is composed of N voltage divider field effect transistors (FM1, FM2 . . . FMi . . . FMN) which are connected in series in sequence, and each of the voltage divider field effect transistors is connected to form a diode structure. More specifically, the source of the first voltage divider field effect transistor FM1 is connected to the external power supply circuit of 5V, so as to introduce the external 5V voltage VBAT. The drain of the Nth voltage divider field effect transistor FMN is grounded, wherein N is a natural number greater than 3. In such a way of connecting with N voltage divider field effect transistors (FM1, FM2 . . . FMi . . . FMN), the external 5V voltage VBAT can be divided into N equally, so that a first voltage Va and a second voltage Vb that are smaller than the withstand voltage of the field effect transistors can be output from the appropriate voltage divider field effect transistor, thus the voltages on other field effect transistors in the entire circuit that are obtain through the first voltage Va or the second voltage Vb are less than their withstand voltage values, that is, no withstand voltage problem in each field effect transistor. It's noted that, the value of N can be specifically selected according to the process of each device in the circuit.

Further, a respective gate of each of the voltage divider field effect transistors is connected to a respective drain thereof, a respective substrate is connected to a respective source thereof, and each of the voltage divider field effect transistors has a same width to length ratio. Each of the voltage divider field effect transistors is a P-type field effect transistor, so as to ensure that the voltages at the source and the drain of the N voltage divider field effect transistors (FM1, FM2 . . . FMi . . . FMN) are exactly the same, and the voltage VBAT is equally divided into N parts. In addition, by adjusting the width to length ratio of N voltage divider field effect transistors (FM1, FM2 . . . FMi . . . FMN), each of the divider field effect transistors can be ensured to operate in the sub-threshold region, and the branch current Ip in the series can be controlled in the order of nA (nanoampere). Furthermore, the first voltage Va is drawn from the source of the (i)th voltage divider field effect transistor FMi, and the second voltage Vb is correspondingly drawn from the source of the (i+1)th voltage divider field effect transistor FM(i+1), wherein 3<i<N, and i is a natural number. In the practical application of the present invention, the value of i is a number preferably close to N/2, which ensures the stable operation of the circuit. The voltage values of the first voltage Va and the second voltage Vb are respectively as follows:

$$Va = i/N \times VBAT;$$

$$Vb = (i+1)/N \times VBAT.$$

As seen from the above, to make ensure that each field effect transistor will not have the withstand voltage problem, the first voltage Va at the voltage dividing point at this time needs to meet:

$$Va = i/N \times VBAT < 3.3V.$$

Therefore, in the practical application, the values of i and N can be reasonably selected, so that the first voltage Va satisfies the above formula. It can be understood that, the first voltage Va may be slightly less than 3.3V in practical application, which not only avoids withstand voltage problem generated in the field effect transistors, but also ensures normal operations of the field effect transistors. Correspondingly, the second voltage Vb is slightly smaller than the first voltage Va, which can also be obtained from the above formula.

Referring to FIG. 1 again, the latching comparator includes a first field effect transistor M1, a second field effect transistor M2, a third field effect transistor M3, a fourth field effect transistor M4, a fifth field effect transistor M5, a sixth field effect transistor M6, a seventh field effect transistor M7 and an eighth field effect transistor M8. Sources of the first field effect transistor M1 and the second field effect transistor M2 are both connected to the external power supply circuit of 5V, and the first field effect transistor M1 and the second field effect transistor M2 are connected in a positive feedback manner. Specifically, the positive feedback manner means that, the gate of the first field effect transistor M1 is connected to the drain of the second field effect transistor M2, and the gate of the second field effect transistor M2 is connected to the drain of the first field effect transistor M1. The second voltage Vb is input to the gate of the third field effect transistor M3, the source of the third field effect transistor M3 is connected to the drain of the first field effect transistor M1, and the drain of the third field effect transistor M3 is connected to the drain of the fifth field effect transistor M5. The first voltage Va is input to the gate of the fifth field effect transistor M5, the source of the fifth field effect transistor M5 is connected to the drain of the seventh field effect transistor M7. The output terminal of the second inverter INV2 is connected to the gate of the seventh field effect transistor M7, and the source of the seventh field effect transistor M7 is grounded. The second voltage Vb is input to the gate of the fourth field effect transistor M4, and the source of the fourth field effect transistor M4 is connected to the drain of the second field effect transistor M2, and the drain of the fourth field effect transistor M4 is connected to the drain of the sixth field effect transistor M7. The first voltage Va is input to the gate of the sixth field effect transistor M6, and the source of the sixth field effect transistor M6 is connected to the drain of the eighth field effect transistor M8. The output terminal of the first inverter INV1 is connected to the gate of the eighth field effect transistor M8, and the source of the eighth field effect transistor M8 is grounded. In the present invention, the first inverter INV1 outputs the signal ENN to the eighth field effect transistor M8, and the second inverter INV2 outputs the signal ENP to the seventh field effect transistor M7, based on this, the latch comparator latches a comparison result by comparing the signals ENN and ENP.

Furthermore, the gated switch sub-circuit includes a ninth field effect transistor M9, a tenth field effect transistor M10, an eleventh field effect transistor M11 and a twelfth field effect transistor M12. Specifically, the drain of the ninth field effect transistor M9 is connected to the external power supply circuit of 5V, the gate of the ninth field effect transistor M9 is connected to the drain of the third field effect transistor M3, the drain of the ninth field effect transistor M9 is connected to the source of the tenth field effect transistor M10; the second voltage Vb is input to the gates of the effect transistor M10 and the eleventh field effect transistor M11, the drain of the tenth field effect transistor M10 and the drain of the eleventh field effect transistor M11 together form an output terminal (not shown) which outputs a voltage VBATO; the source of the eleventh field effect transistor M11 is connected to the drain of the twelfth field effect transistor M12, and the gate of the twelfth field effect transistor M12 is connected to the drain of the seventh field effect transistor M7, and the source of the seventh field effect transistor M7 is grounded. In the gated switch sub-circuit diagram, the power gating circuit is closed when the control signal EN is at a high level of 3.3V, at this time, VBAT=VBATO; while the power gating circuit is shutdown when the control signal EN is at a low level of 0V, at which time the voltage VBATO is pulled down to the ground.

In a preferred embodiment of the present invention, the first field effect transistor M1, the second field effect transistor M2, the third field effect transistor M3, the fourth field effect transistor M4, the ninth field effect transistor M9 and the tenth field effect transistor M10 are all P-type field effect transistors, and their substrates are all connected to the external power supply circuit of 5V. The fifth field effect transistor M5, the sixth field effect transistor M6, the seventh field effect transistor M7, and the eighth field effect transistor M8, the eleventh field effect transistor M11 and the twelfth field effect transistor M12 are all N-type field effect transistors, and their substrates are all connected to a low level. It should be noted that, the connections of the substrates of the above-mentioned field effect transistors are not shown in the figure.

Furthermore, in the present invention, the third field effect transistor M3, the fourth field effect transistor M4, the fifth field effect transistor M5, the sixth field effect transistor M6, the tenth field effect transistor M10 and the eleventh field effect transistor M11 are withstand voltage preventing switch transistors, which can clamp the voltage during the operation of the circuit, prevent the poor withstand voltage problem in the devices, and ensure the normal operation of the circuit.

It can be seen that, in the power gating circuit of the present invention, the voltage values of the first voltage and the second voltage output by the voltage divider sub-circuit are both smaller than the withstand voltage value of the field effect transistor, thus the voltages of other field effect transistors obtained through the first voltage or the second voltage are all smaller than their withstand voltage values, that is, problems of poor withstand voltage for all field effect transistors will not occurred during the circuit operation. Accordingly, in the voltage divider sub-circuit, N>3, so that the voltage on each of the voltage divider field effect transistors must also be less than 3.3V, in other words, there is no withstand voltage problem inside the voltage divider sub-circuit. Therefore, the power gating circuit of the present invention overcomes the influence of the withstand voltage problem on the circuit, improves the stability of the circuit, and extending the using life of the entire circuit.

Please refer to FIG. 2 again, a circuit structure diagram of an embodiment of the power gating circuit of the present invention is shown. As illustrated, in this embodiment, the value of N is 9, and the value of i is 5, that is:

$$Va=5/9 \times VBAT;$$

$$Vb=4/9 \times VBAT; \text{ and}$$

$$Va=5/9 \times VBAT<3.3v.$$

Other structures are the same as in FIG. 1, which are not repeated here.

Figure 2:
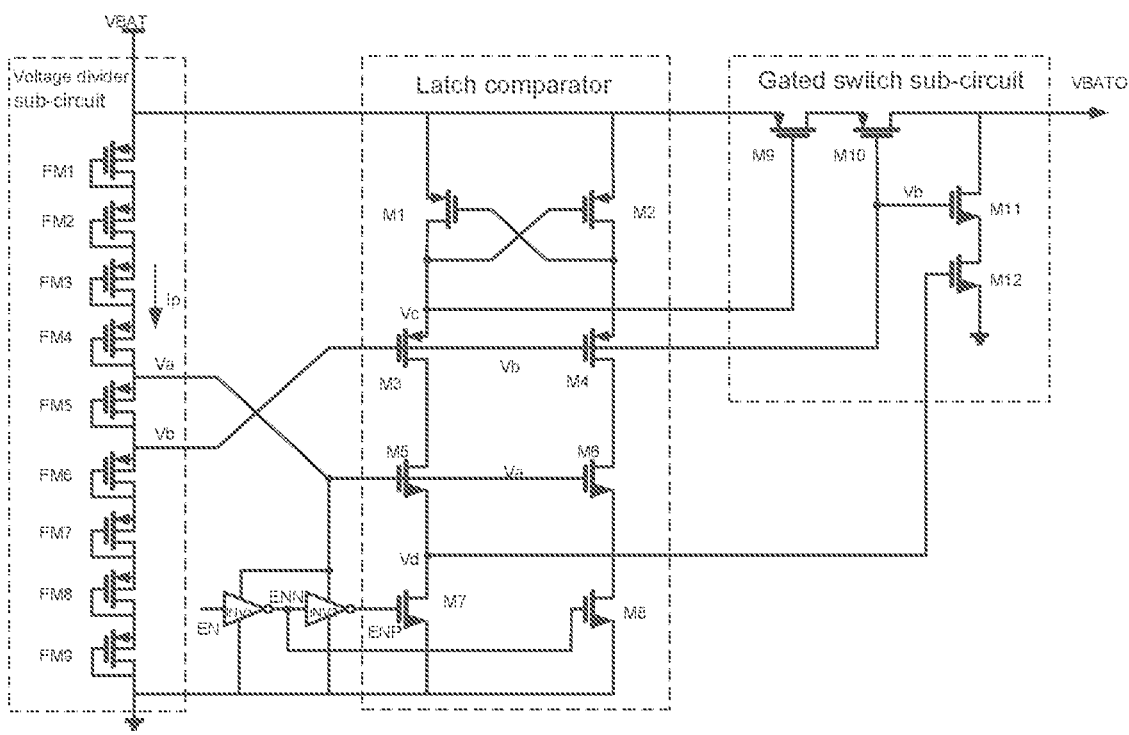
FIG. 2 is a circuit structure diagram of an embodiment of the power gating circuit of the present invention.

Combing with FIG. 2, the working principle of the power gating circuit of the present invention is described.

In the power gating circuit of the present invention, the first voltage Va after divided by the voltage divider sub-circuit is served as the supply voltages for the two inverters INV1 and INV2. As known, an inverter locked in an operation state has a leakage current of pA (picoampere) level which is much smaller than the current Ip, thus the voltage Va will not have an impact after the inverters INV1 and INV2 are locked.

When the control signal EN is at a high level of 3.3V, the output signal ENN of the first inverter INV1 is at a low level, and the output signal ENP of the second inverter INV2 is at a high level Va. Through the third field effect transistor M3, the fourth field effect transistor M4, the fifth field effect transistor M5, the sixth field effect transistor M6 and the first field effect transistor M1 and the second field effect transistor M2 of the positive feedback circuit, the latch comparator makes the voltage as follows:

$$V_d=0;$$

$$V_c=V_b+|V_{GSM3}|;$$

wherein, $V_{GSM3}$ indicates the gate-source voltage of the third field effect transistor M3.

After the latch comparator enters a stable state, the current flowing through the branch of the first field effect transistor M1, the third field effect transistor M3, the fifth field effect transistor M5, and the seventh field effect transistor M7 and the current flowing through the second field effect transistor M2, the fourth field effect transistor M4, the sixth field effect transistor M6, and the eighth field effect transistor M8 are in pA level, so the value of $V_{GSM3}$ of the third field effect transistor M3 in the formula is quite small, and the gate-source voltage $V_{GS}$ of the ninth field effect transistor M9 used as the switch transistor is calculated as follows:

$$|V_{GSM9}|VBAT-V_c=V_a-|V_{GMS3}|<3.3V, \text{ wherein, } V_{GSM9}$$

indicates the gate-source voltage of the ninth field effect transistor M9.

Since the voltage Va is slightly less than 3.3V and the voltage $V_{GSM9}$ is quite small, the ninth field effect transistor M9 can be guaranteed to be turned on smoothly to serve as a switch transistor, that is, the voltages of the drain and the sources are the same, therefore, the gate-drain voltage and drain-source voltage has the problem of poor withstand voltage.

For the tenth field effect transistor M10:

$$|V_{GSM10}|VBAT-V_b=V_a<3.3V, \text{ wherein, } V_{GSM10} \text{ indicates}$$

the gate-source voltage of the tenth field effect transistor M10.

It can be seen that, the gate-source voltage of the tenth field effect transistor M10 is also slightly less than 3.3V, and the tenth field effect transistor M10 is also used as a switch transistor, which ensures that neither the gate-drain voltage nor the drain-source voltage has a problem of poor withstand voltage.

Since the voltage Vd=0, the twelfth field effect transistor M12 as a switch transistor is turned off, and its drain voltage is Vb-VGSM11<3.3V, which ensures that the twelfth field effect transistor M12 has no withstand voltage problem.

For the eleventh field effect transistor M11:

$$|V_{DSM11}|=VBAT-V_b-V_{GSM11}=V_a-V_{GSM11}<3.3V,$$

wherein, $V_{GSM11}$ indicates the gate-source voltage of the eleventh field effect transistor M11, and $V_{DSM11}$ indicates the drain-source voltage of the eleventh field effect transistor M11.

Therefore, the eleventh field effect transistor M11 also has no withstand voltage problem.

By using the same analysis method as above, it can be calculated that none of the field effect transistors M1-M8 has withstand voltage problem, and all CMOS devices in the entire circuit have no poor withstand voltage problem, and meanwhile the ninth and tenth field effect transistors M9 and M 10 as switch transistors can be smoothly turned on.

When the control signal EN is a low level 0, the output signal ENN of the first inverter INV1 is a high level Va, the output signal ENP of the second inverter INV2 is a low level 0, by using the turned-on withstand voltage switches including the third field effect transistor M3, the fourth field effect transistor M4, the fifth field effect transistor M5 and the sixth field effect transistor M6, and the positive feedback circuit including the first field effect transistor M1 and the second field effect transistor M2, the latch comparator makes the voltage as follows:

$$V_c=VBAT;$$

$$V_d=V_a-|V_{GSM5}|;$$

wherein, $V_{GSM5}$ indicates the gate-source voltage of the fifth field effect transistor M5.

Similarly, After the latch comparator enters a stable state, the current flowing through the branches of the first field effect transistor M1, the third field effect transistor M3, the fifth field effect transistor M5, and the seventh field effect transistor M7 and the current flowing through the branches of the second field effect transistor M2, the fourth field effect transistor M4, the sixth field effect transistor M6, and the eighth field effect transistor M8 are in pA level, so the value of $V_{GSM5}$ in the formula is very small, and the voltage Vd is close to 3.3V, which ensures that the twelfth field effect transistor M12 as the switch transistor can be turned on smoothly. At this time, the gate-source voltage of the eleventh field effect transistor M11 as the switch transistor is Vb, which ensures that it can be turned on smoothly, without withstand voltage problem. At this time, the voltage VBATO is pulled down to the ground, that is, the circuit connected to VBATO is pulled down to the ground level, thereby reliably turning off the related circuits powered by VBATO.

The voltage Vc is the highest voltage VBAT, thus the ninth field effect transistor M9 can be reliably turned off, and the tenth field effect transistor M10 is also turned off. At this time, the two turn-off switch transistors are connected in series in the path from the voltages VBAT to VBATO (ground level, at this time), which are high-resistance voltage divider and has the same impedance, which can avoid the withstand voltage problem.

By using the same analysis method as above, it can be calculated that none of the field effect transistors M1-M8 has a withstand voltage problem, and all CMOS devices in the entire circuit have no poor withstand voltage problem.

Through the above analysis, when the control signal EN is a low level, the ninth field effect transistor M9 and the tenth field effect transistor M10 as switch transistors are reliably turned off, and the voltage VBATO passes through the ninth field effect transistor M9 and the tenth field effect transistor M10 and is pulled down to the ground level to output zero level, thereby reliably turning off the circuit connected to the terminal VBATO, and all devices have no poor withstand voltage problem.

While the invention has been described in connection with what are presently considered to be the most practical and preferred embodiments, it is to be understood that the invention is not to be limited to the disclosed embodiments, but on the contrary, is intended to cover various modifications and equivalent arrangements included within the spirit and scope of the invention.

What is claimed is:

1. A power gating circuit, comprising two inverters and a voltage divider sub-circuit, a latch comparator, and a gated switch sub-circuit connected to an external power supply circuit of 5V, respectively; wherein the voltage divider sub-circuit is configured to divide a voltage of 5V output by the external power supply circuit of 5V and output a first voltage and a second voltage to the latch comparator and the gated switch sub-circuit, both voltage values of the first voltage and the second voltage are smaller than a withstand voltage value of a field effect transistor, and the voltage value of the first voltage is greater than that of the second voltage; the first voltage is configured to provide an operation voltage for the two inverters which are connected in series, an external control signal is input to the two inverters in sequence; the latch comparator is configured to compare two signals output by the two inverters and then latch a comparison result; and the gated switch sub-circuit is further connected with the latch comparator and configured to turn off or turn on the power gating circuit to control an output voltage according to a voltage value of the external control signal.

2. The power gating circuit according to claim 1, wherein the voltage divider sub-circuit is composed of N voltage divider field effect transistors which are connected in series, each of the voltage divider field effect transistors is connected to form a diode structure, a source of a first voltage divider field effect transistor is connected to the external power supply circuit of 5V, and a drain of the Nth voltage divider field effect transistor is grounded, wherein N is a natural number greater than 3.

3. The power gating circuit according to claim 2, wherein a respective gate of each of the voltage divider field effect transistors is connected to a respective drain thereof, a respective substrate is connected to a respective source thereof, and each of the voltage divider field effect transistors has a same width to length ratio.

4. The power gating circuit according to claim 3, wherein each of the voltage divider field effect transistors is a P-type field effect transistor, a first voltage is drawn from a source of a (i)th voltage divider field effect transistor, and a second voltage is correspondingly drawn from a source of a (i+1)th voltage divider field effect transistor, wherein 3<i<N, and i is a natural number.

5. The power gating circuit according to claim 2, wherein the latching comparator comprises a first field effect transistor, a second field effect transistor, a third field effect transistor, a fourth field effect transistor, a fifth field effect transistor, a sixth field effect transistor, a seventh field effect transistor and an eighth field effect transistor; sources of the first field effect transistor and the second field effect transistor are both connected to the external power supply circuit of 5V, and the first field effect transistor and the second field effect transistor are connected in a positive feedback manner; the second voltage is input to a gate of the third field effect transistor, a source of the third field effect transistor is connected to a drain of the first field effect transistor, and a drain of the third field effect transistor is connected to a drain of the fifth field effect transistor; the first voltage is input to a gate of the fifth field effect transistor, a source of the fifth field effect transistor is connected to a drain of the seventh field effect transistor; an output terminal of a second inverter is connected to a gate of the seventh field effect transistor, and a source of the seventh field effect transistor is grounded; the second voltage is input to a gate of the fourth field effect transistor, and a source of the fourth field effect transistor is connected to a drain of the second field effect transistor, and a drain of the fourth field effect transistor is connected to a drain of the sixth field effect transistor; the first voltage is input to a gate of the sixth field effect transistor, and a source of the sixth field effect transistor is connected to a drain of the eighth field effect transistor; an output terminal of a first inverter is connected to a gate of the eighth field effect transistor, and a source of the eighth field effect transistor is grounded.

6. The power gating circuit according to claim 5, wherein the gated switch sub-circuit comprises a ninth field effect transistor, a tenth field effect transistor, an eleventh field effect transistor and a twelfth field effect transistor; a drain of the ninth field effect transistor is connected to the external power supply circuit of 5V, a gate of the ninth field effect transistor is connected to the source of the third field effect transistor, a drain of the ninth field effect transistor is connected to a source of the tenth field effect transistor, and the second voltage is input to gates of the tenth and eleventh field effect transistors, a drain of the tenth field effect transistor and a drain of the eleventh field effect transistor together form an output terminal, a source of the eleventh field effect transistor is connected to a drain of the twelfth field effect transistor, a gate of the twelfth field effect transistor is connected to the drain of the seventh field effect transistor, and a source of the twelfth field effect transistor is grounded.

7. The power gating circuit according to claim 6, wherein the first field effect transistor, the second field effect transistor, the third field effect transistor, the fourth field effect transistor, the ninth field effect transistor and the tenth field effect transistor are all P-type field effect transistors, and their respective substrates are all connected to the external power supply circuit of 5V.

8. The power gating circuit according to claim 6, wherein the fifth field effect transistor, the sixth field effect transistor, the seventh field effect transistor, the eighth field effect transistor, the eleventh field effect transistor and the twelfth field effect transistor are all N-type field effect transistors, and their respective substrates are all connected to a low level.

9. The power gating circuit according to claim 6, wherein the third field effect transistor, the fourth field effect transistor, the fifth field effect transistor, the sixth field effect transistor, the tenth field effect transistor and the eleventh field effect transistor are withstand voltage preventing switch transistors.

10. The power gating circuit according to claim 5, wherein the first field effect transistor and the second field effect transistor are connected in a positive feedback manner, the gate of the first field effect transistor is connected to the drain of the second field effect transistor, and the gate of the second field effect transistor is connected to the drain of the second field effect transistor.

\* \* \* \* \*